(12) United States Patent
Hattori et al.

(10) Patent No.: US 9,115,707 B2
(45) Date of Patent: Aug. 25, 2015

(54) INVERTER MODULE AND INTEGRATED-INVERTER ELECTRIC COMPRESSOR USING THE SAME

(75) Inventors: Makoto Hattori, Tokyo (JP); Hidetaka Sato, Tokyo (JP); Takashi Nakagami, Tokyo (JP); Kazunori Teshima, Tokyo (JP); Mitsuaki Arita, Aichi (JP); Masashi Fujita, Aichi (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 879 days.

(21) Appl. No.: 13/139,906

(22) PCT Filed: Jun. 2, 2010

(86) PCT No.: PCT/JP2010/059347
§ 371 (c)(1),
(2), (4) Date: Jul. 12, 2011

(87) PCT Pub. No.: WO2010/146993
PCT Pub. Date: Dec. 23, 2010

(65) Prior Publication Data
US 2011/0261588 A1    Oct. 27, 2011

(30) Foreign Application Priority Data

Jun. 18, 2009  (JP) ................................. 2009-145014

(51) Int. Cl.
*H02M 7/00*    (2006.01)
*F04B 39/12*   (2006.01)
(Continued)

(52) U.S. Cl.
CPC .......... *F04B 39/121* (2013.01); *H02K 11/0073* (2013.01); *H02K 11/022* (2013.01);
(Continued)

(58) Field of Classification Search
CPC ............. F04B 39/121; H02K 11/0073; H02K 11/0005; H02M 7/003
See application file for complete search history.

(56) References Cited

U.S. PATENT DOCUMENTS 5,473,111 A * 12/1995 Hattori et al. ................. 174/363
5,872,332 A *  2/1999 Verma ........................... 174/386
(Continued)

FOREIGN PATENT DOCUMENTS

JP         61-7097 U       1/1986
JP         11-127583 A     5/1999
(Continued)

OTHER PUBLICATIONS

International Search Report of PCT/JP2010/059347, mailing date Aug. 24, 2010.
(Continued)

*Primary Examiner* — Jared Fureman
*Assistant Examiner* — Joel Barnett
(74) *Attorney, Agent, or Firm* — Westerman, Hattori, Daniels & Adrian, LLP (57) ABSTRACT

An inverter module and an integrated-inverter electric compressor using the same, which can eliminate noise interference, noise leakage, and the like attributable to a smoothing capacitor accommodated therein and which can be reduced in size and weight is provided. An inverter module (11) includes a resin module case (17); a power system board (15) provided on a bottom side of the module case (17); and a control board (19) provided on an upper side of the module case (17). A smoothing capacitor (18) connected to a power supply line for the power system board (15) is incorporated into the module case (17), and the smoothing capacitor (18) is electromagnetically shielded with respect to the power system board (15) and the control board (19).

7 Claims, 6 Drawing Sheets (51) Int. Cl.
*H02K 11/00* (2006.01)
*H02K 11/02* (2006.01)

(52) U.S. Cl.
CPC ............... *H01L2224/48091* (2013.01); *H01L 2224/48137* (2013.01); *H01L 2224/48139* (2013.01); *H01L 2224/49111* (2013.01); *H02M 7/003* (2013.01)

(56) References Cited

U.S. PATENT DOCUMENTS

| | | | |
|---|---|---|---|
| 6,215,679 B1 * | 4/2001 | Yamane et al. | 363/132 |
| 2003/0128535 A1 * | 7/2003 | Otani et al. | 361/816 |
| 2003/0200761 A1 * | 10/2003 | Funahashi et al. | 62/228.4 |
| 2004/0169429 A1 * | 9/2004 | Howe et al. | 310/89 |
| 2004/0194486 A1 * | 10/2004 | Kurita et al. | 62/228.4 |
| 2005/0223727 A1 | 10/2005 | Funahashi et al. | |
| 2006/0064998 A1 | 3/2006 | Funahashi et al. | |
| 2008/0116838 A1 * | 5/2008 | Hattori et al. | 318/722 |
| 2009/0040724 A1 * | 2/2009 | Nishikimi et al. | 361/699 |

FOREIGN PATENT DOCUMENTS

| | | |
|---|---|---|
| JP | 2003-324903 A | 11/2003 |
| JP | 2004-335625 A | 11/2004 |
| JP | 3827158 B2 | 9/2006 |
| JP | 2009-127443 A | 6/2009 |
| WO | 2009/066484 A1 | 5/2009 |

OTHER PUBLICATIONS

Japanese Decision to Grant a Patent dated Feb. 25, 2014, issued in corresponding Japanese Patent Application No. 2009-145014 (3 pages), "The Decision to Grant a Patent has been received".

* cited by examiner

FIG. 6

INVERTER MODULE AND INTEGRATED-INVERTER ELECTRIC COMPRESSOR USING THE SAME

TECHNICAL FIELD

The present invention relates to inverter modules and integrated-inverter electric compressors using the same, which are suitable for use in vehicle air-conditioners.

BACKGROUND ART

Integrated-inverter electric compressors having an integrated inverter device are used for compressors for air-conditioners installed in hybrid cars, electric cars, etc. Such an integrated-inverter electric compressor is configured such that an inverter accommodating portion (inverter box) is provided on the outer periphery of a housing accommodating an electric motor and a compression mechanism, and an inverter device that converts DC power supplied from a high-voltage power source to AC power and applies the power to the electric motor in the housing via glass-sealed terminals is mounted therein.

A typical inverter device is formed of a power system board connected to a P-N power line, on which are mounted high-voltage electric components, such as a smoothing capacitor (capacitor) and an inductor coil (a common mode coil or a normal mode coil) for reducing current ripple and common mode noise, and a switching circuit composed of semiconductor switching devices, such as IGBTs, the power system board converting DC power to three-phase AC power to apply the power to an electric motor; a control board on which is mounted a control-and-communication circuit, such as a CPU, composed of devices operating at a low voltage, the control board controlling the AC power applied to the electric motor; and the like. These boards are integrated and mounted to the outer periphery of the housing (for example, see PTL 1).

Because integrated-inverter electric compressors for vehicle air-conditioners are mounted in small engine compartments, they are preferably reduced in size and weight as much as possible, and the same is true for inverter devices mounted therein. In order to make the inverter devices compact and to simplify assembly, those in which the power system board and the control board are integrated as a module via a resin module case have been proposed, in which a thin smoothing capacitor, such as a ceramic capacitor or a film capacitor, and a filter capacitor for removing common mode noise, are accommodated in this inverter module (for example, see PTL 2).

CITATION LIST

Patent Literature

{PTL 1} The Publication of Japanese Patent No. 3827158
{PTL 2} Japanese Unexamined Patent Application, Publication No. 2004-335625

SUMMARY OF INVENTION

Technical Problem

However, if a high-voltage electric component, such as a smoothing capacitor, is directly accommodated in the inverter module as above, the smoothing capacitor itself causes noise, resulting in a situation in which the smoothing capacitor radiates electromagnetic noise to the power system board and the control board. This electromagnetic noise causes noise interference on the power system board and the control board, contributing to malfunction of the inverter device, and also leaks out through a control communication cable or a power cable connected to the inverter device, which may adversely affect other electric components.

The present invention has been made in view of the above-described circumstances, and an object thereof is to provide an inverter module and an integrated-inverter electric compressor using the same, which can eliminate noise interference, noise leakage, and the like attributable to a smoothing capacitor accommodated therein and which can be reduced in size and weight.

Solution to Problem

To solve the above-described problem, an inverter module and an integrated-inverter electric compressor of the present invention employ the following solutions.

That is, an inverter module according to an aspect of the present invention includes a resin module case; a power system board provided on a bottom side of the module case, the power system board converting DC power supplied from a power source to AC power to apply the power to an electric motor; and a control board provided on an upper side of the module case, the control board controlling the AC power applied to the electric motor. A smoothing capacitor connected to a power supply line for the power system board is incorporated into the module case, and the smoothing capacitor is electromagnetically shielded with respect to the power system board and the control board.

According to the above aspect, the smoothing capacitor is incorporated into the module case for the inverter module that is composed of the module case, the power system board, and the control board. Thus, the smoothing capacitor, which is a high-voltage electric component, can be integrally incorporated into the inverter module. Accordingly, the inverter device as a whole can be made compact and the assembly thereof can be simplified. Because the smoothing capacitor is electromagnetically shielded with respect to the power system board and the control board, the propagation of electromagnetic noise radiated from the smoothing capacitor to the power system board and the control board can be blocked. Thus, malfunction of the inverter device and noise leakage to the outside due to noise interference can be suppressed.

Furthermore, in the inverter module according to an aspect of the present invention, in the above-described inverter module, the smoothing capacitor is disposed in a space between the power system board and the control board in the module case and is electromagnetically shielded by metal shielding plates sandwiching the smoothing capacitor from above and below.

According to the above aspect, because the smoothing capacitor is disposed in the space between the power system board and the control board in the module case and is electromagnetically shielded by the metal shielding plates disposed thereabove and therebelow, the electromagnetic noise radiated from the smoothing capacitor to the power system board and the control board can be blocked by the metal shielding plates disposed thereabove and therebelow. Thus, noise interference and noise leakage due to the electromagnetic noise radiated from the smoothing capacitor can be suppressed.

Furthermore, in the inverter module according to an aspect of the present invention, in the above-described inverter module, the smoothing capacitor is electromagnetically shielded by a metal case surrounding the outer periphery and is disposed in the module case.

According to the above aspect, because the smoothing capacitor is electromagnetically shielded by a metal case surrounding the outer periphery thereof and is disposed in the module case, the propagation of electromagnetic noise radiated from the smoothing capacitor to the power system board and the control board can be blocked by the metal case surrounding the outer periphery thereof. Thus, noise interference and noise leakage due to the electromagnetic noise radiated from the smoothing capacitor can be suppressed.

Furthermore, in the inverter module according to an aspect of the present invention, in any one of the above-described inverter modules, the metal shielding plates or the metal case is connected to a ground earth terminal that is formed integrally with the module case by insert molding.

According to the above aspect, because the metal shielding plates or the metal case is connected to the ground earth terminal that is formed integrally with the module case by insert molding, a noise current of the electromagnetic noise or the like propagating from the smoothing capacitor to the metal shielding plates or the metal case is reliably grounded through the ground earth terminal, to which the metal shielding plates or the metal case is connected. Accordingly, leakage of the electromagnetic noise radiated from the smoothing capacitor to the outside can be suppressed.

Furthermore, in the inverter module according to an aspect of the present invention, in the above-described inverter module, the ground earth terminal is formed integrally with a fixing leg provided on the module case by insert molding, and the inverter module is configured to be frame-grounded to the housing when secured to the housing or the like via the fixing leg.

According to the above aspect, the ground earth terminal is formed integrally with a fixing leg provided on the module case by insert molding, and the inverter module is configured to be frame-grounded to the housing when secured to the housing or the like via the fixing leg. Thus, by securing the inverter module to the housing or the like, the ground earth terminal can be frame-grounded to the housing, whereby the metal shielding plates or the metal case can be reliably frame-grounded. Accordingly, leakage of the electromagnetic noise radiated from the smoothing capacitor to the outside can be reliably suppressed.

In addition, in an integrated-inverter electric compressor according to an aspect of the present invention, an inverter accommodating portion is provided on the outer periphery of a housing accommodating a compression mechanism and an electric motor for driving the compression mechanism, and an inverter device including the above-described inverter module is integrally incorporated in the inverter accommodating portion.

According to the above aspect, because an inverter accommodating portion is provided on the outer periphery of a housing accommodating a compression mechanism and an electric motor for driving the compression mechanism, and an inverter device including any one of the above-described inverter modules is integrally incorporated in the inverter accommodating portion, the volume of the inverter accommodating portion accommodating the inverter device can be reduced by an amount corresponding to the reduction in size of the inverter device, and the size of the housing serving as an outer shell of the electric compressor can be reduced. Accordingly, it is possible to reduce the size and weight of the integrated-inverter electric compressor, improving the ease of installation in a vehicle or the like. Because noise interference and noise leakage of the inverter device can be suppressed, it is possible to increase the reliability of the products, while preventing malfunction or the like of the inverter device due to noise interference.

Furthermore, in the integrated-inverter electric compressor according to an aspect of the present invention, in the above-described integrated-inverter electric compressor, the inverter module is secured to the inside of the inverter accommodating portion via the fixing leg of the module case so as to be frame-grounded to the housing.

According to the above aspect, because the inverter module is secured to the inside of the inverter accommodating portion via the fixing leg of the module case so as to be frame-grounded to the housing, a noise current of the electromagnetic noise or the like radiated from the smoothing capacitor incorporated into the inverter module can be frame-grounded to the housing via the fixing leg and the inverter accommodating portion and can be reliably frame-grounded. Accordingly, it is possible to increase the reliability of the products, while reliably preventing malfunction of the inverter device and noise leakage to the outside due to noise interference.

Advantageous Effects of Invention

According to the inverter module of the present invention, because the smoothing capacitor, which is a high-voltage electric component, can be integrally incorporated into the inverter module, the inverter device as a whole can be made compact and the assembly thereof can be simplified. Because the smoothing capacitor is electromagnetically shielded with respect to the power system board and the control board, the propagation of electromagnetic noise radiated from the smoothing capacitor to the power system board and the control board can be blocked. Thus, malfunction of the inverter device and noise leakage to the outside due to noise interference can be suppressed.

According to the integrated-inverter electric compressor of the present invention, the volume of the inverter accommodating portion accommodating the inverter device can be reduced by an amount corresponding to the reduction in size of the inverter device, and the size of the housing serving as an outer shell of the electric compressor can be reduced. Accordingly, it is possible to reduce the size and weight of the integrated-inverter electric compressor, improving the ease of installation in a vehicle or the like. Because noise interference and noise leakage of the inverter device can be suppressed, it is possible to increase the reliability of the products, while preventing malfunction or the like of the inverter device due to noise interference.

DESCRIPTION OF EMBODIMENTS

Embodiments of the present invention will be described below with reference to the drawings.

First Embodiment

A first embodiment of the present invention will be described using FIGS. 1 to 4.

Figure 1:
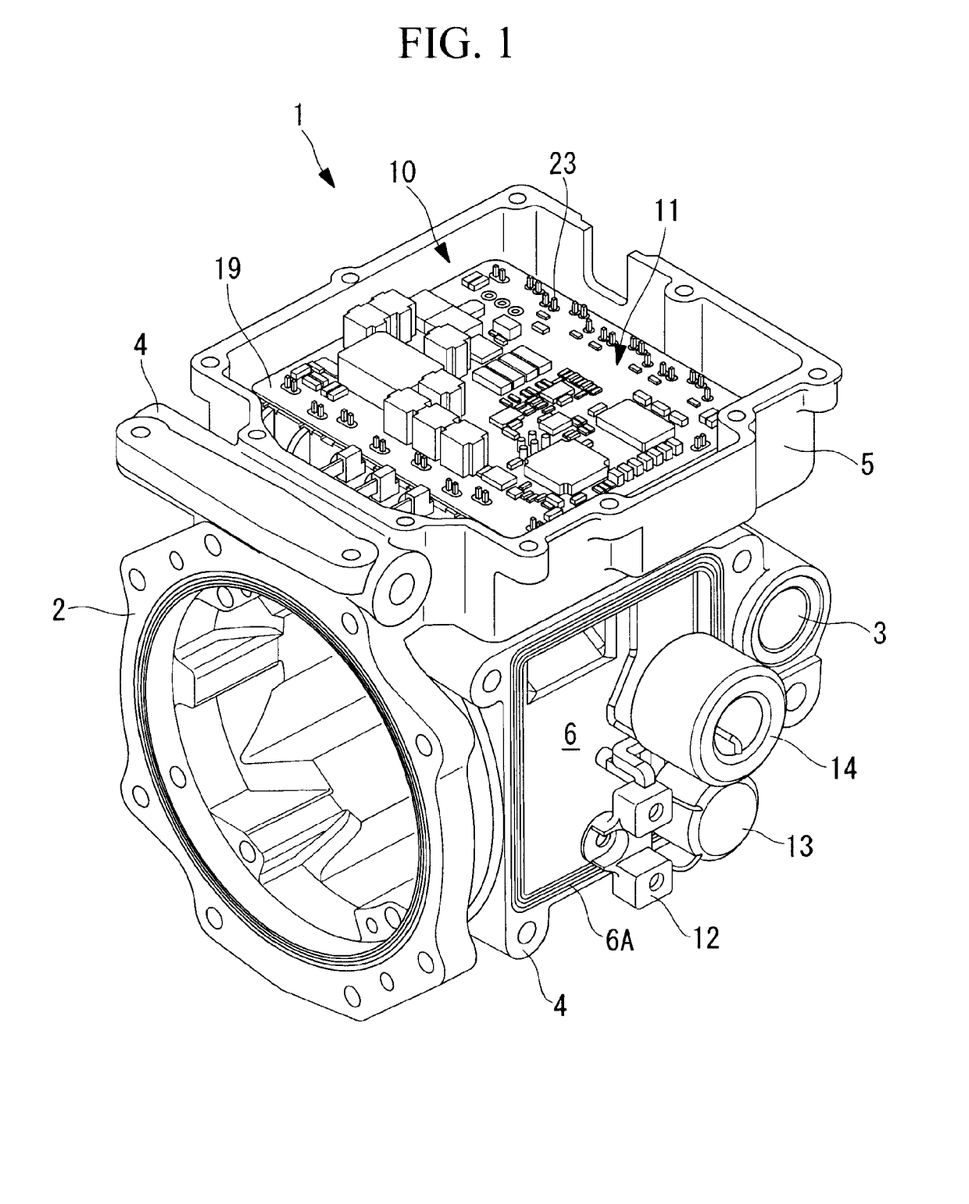
FIG. 1 is an external perspective view of a relevant part of an integrated-inverter electric compressor having an inverter module mounted therein, according to a first embodiment of the present invention.

An integrated-inverter electric compressor 1 includes a cylindrical housing 2 serving as an outer shell. The housing 2 has a configuration in which a motor housing for accommodating an electric motor and a compressor housing for accommodating a compression mechanism, the housings being formed of die cast aluminum, are joined into a single component with bolts. In this embodiment, only the motor housing side is shown.

The electric motor and the compression mechanism (not shown) accommodated in the housing 2 are configured to be connected to each other by a motor shaft such that the rotation of the electric motor drives the compression mechanism. The housing (motor housing) 2 has a refrigerant intake port 3 at the rear end (on the right side in FIG. 1). Low-pressure refrigerant gas taken into the housing 2 from the refrigerant intake port 3 circulates around the electric motor in the direction of the motor axis and is introduced into the compression mechanism where it is compressed. The system is configured such that high-temperature high-pressure refrigerant gas compressed in the compression mechanism is discharged into the housing (compressor housing) 2 and directed outside from a discharge port (not shown) provided at the front end of the housing (compressor housing) 2.

Mounting legs 4 are provided on the outer periphery of the housing 2, at three locations in total; for example, at the bottom of the rear end and at the bottom and at the top of the front end. The integrated-inverter electric compressor 1 is secured to brackets provided on a side wall or the like of a driving engine of a vehicle with bolts etc., via these mounting legs 4 and is installed in the vehicle. The integrated-inverter electric compressor 1 is supported by a cantilever at least at three points at the top and bottom, such that one side wall thereof extends along the brackets and such that the direction of the motor axis is aligned with the front-rear direction or left-right direction of the vehicle.

A first inverter accommodating portion 5 having a substantially square shape in plan view is formed integrally with an upper portion of the outer peripheral surface of the housing 2. This first inverter accommodating portion 5 has the shape of an open-topped box enclosed by surrounding walls having a predetermined height and accommodates an inverter module 11 of an inverter device 10 (described below). Although not shown, the opening at the top surface is configured to be sealed by a cover member.

A flange portion 6A constituting a second inverter accommodating portion 6 is formed integrally with a side wall of the housing 2. A terminal base 12 of the inverter device 10 (described below) and a small case (not shown) constituting the second inverter accommodating portion 6 that accommodates high-voltage electric components, such as a common mode coil 13 and a normal mode coil 14 for removing common mode noise, are secured to this flange portion 6A with fastening bolts. The second inverter accommodating portion 6 and the first inverter accommodating portion 5 are communicated with each other at the housing 2 side in order to route a power line.

The inverter device 10 disposed in the first inverter accommodating portion 5 and the second inverter accommodating portion 6 is formed of the inverter module 11 accommodated in the first inverter accommodating portion 5, the terminal base 12 accommodated in the second inverter accommodating portion 6, and high-voltage electric components, such as the common mode coil 13 and the normal mode coil 14. A P-N power cable (not shown) is connected to the terminal base 12, and the common mode coil 13 and the normal mode coil 14 are electrically connected, through their lead wires, to the power line, in a known manner, via a plurality of terminals provided on the terminal base 12. Moreover, the lead wires of the common mode coil 13 and the normal mode coil 14 are connected to a pair of P-N terminals 21 (described below) of the inverter module 11.

Figure 2:
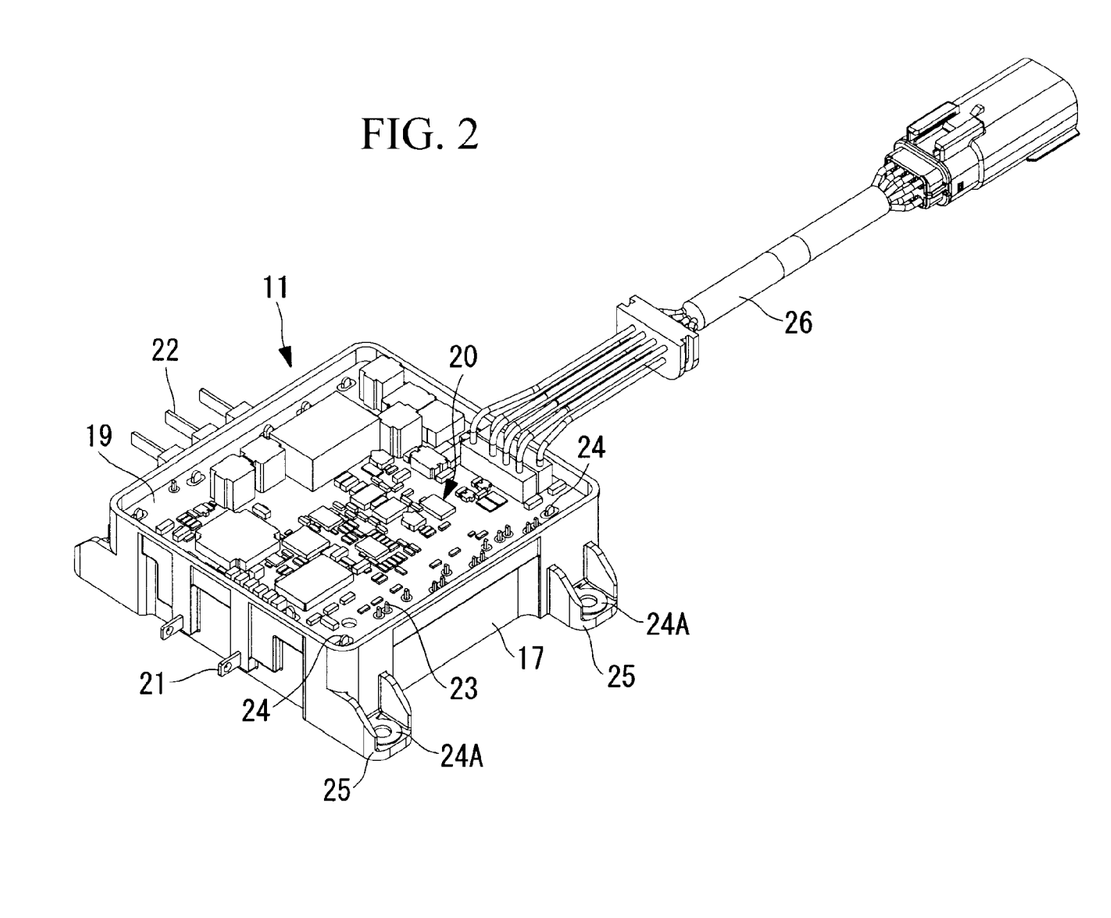
FIG. 2 is an external perspective view of the inverter module mounted in the integrated-inverter electric compressor shown in FIG. 1.
Figure 3:
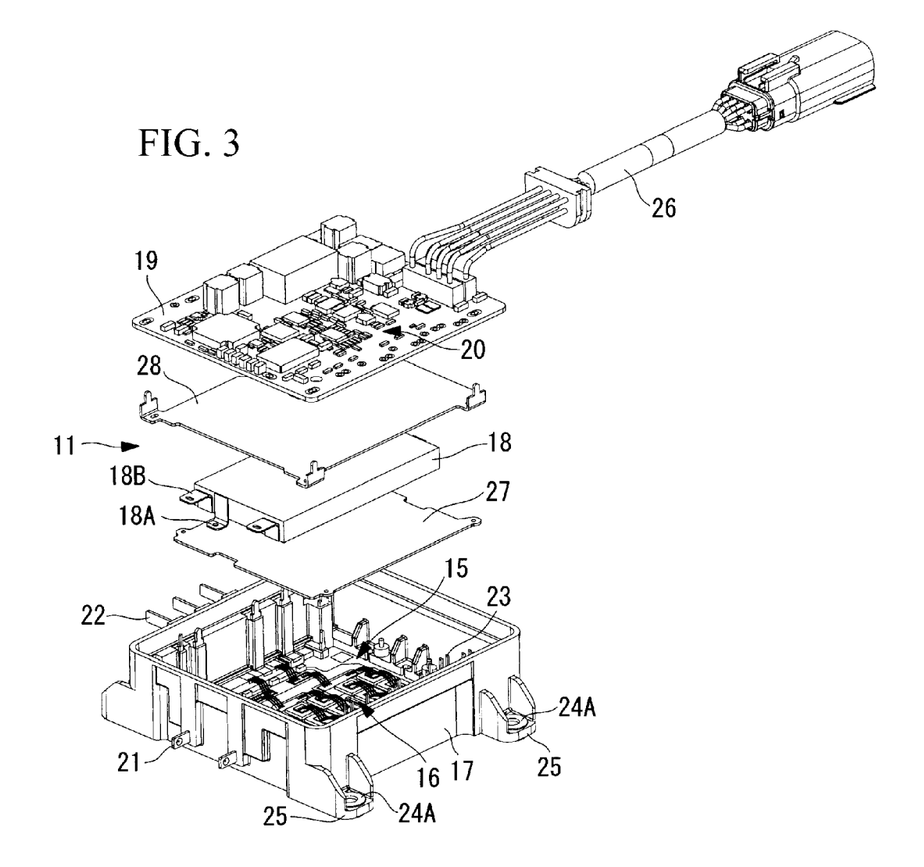
FIG. 3 is an exploded perspective view of the inverter module shown in FIG. 2.
Figure 4:
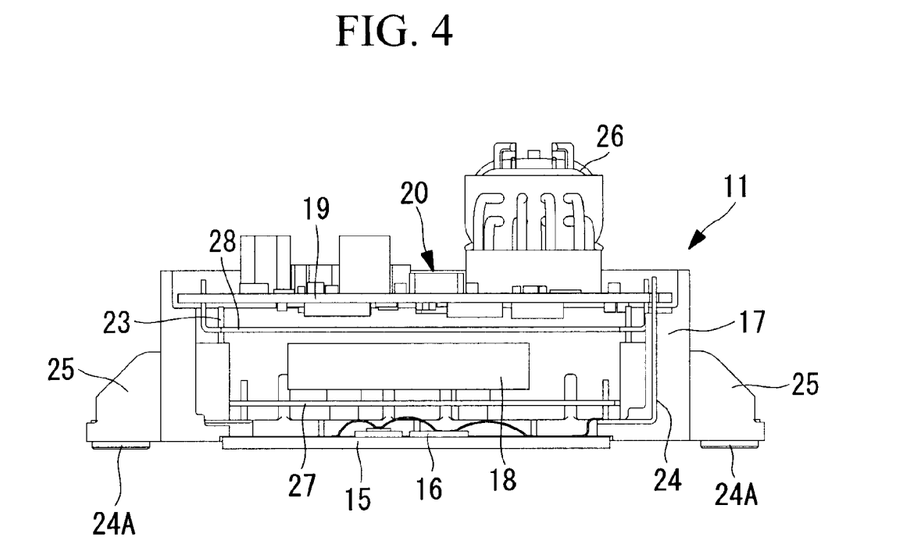
FIG. 4 is a vertical cross-sectional view of the inverter module shown in FIG. 2.

As shown in FIGS. 2 to 4, the inverter module 11 is configured to include a power system board 15 made of an aluminum plate or the like, on which a switching circuit 16 composed of a plurality of semiconductor switching devices, such as IGBTs, and the like are mounted, the power system board 15 converting DC power to three-phase AC power and applying the power to the electric motor; a resin module case 17 formed integrally with this power system board 15 by insert molding; a smoothing capacitor (capacitor) 18 that is disposed on the power system board 15 and is connected to the power line in parallel with the power system board 15; and a control board 19, on which a control-and-communication circuit 20 composed of devices operating at a low voltage, such as a CPU, and the like are mounted, the control board 19 controlling the AC power applied to the electric motor.

Besides the power system board 15, a pair of P-N terminals 21, to which the power line is connected, as described above; U-V-W terminals 22 that apply three-phase AC power to the electric motor via glass-sealed terminals; multiple connecting terminals 23 that connect the power system board 15 to the control board 19; a plurality of ground earth terminals 24 that are electrically connected to high-voltage ground systems of the power system board 15 and low-voltage ground systems of the control board 19; and the like are formed integrally with the resin module case 17 by insert molding. The control board 19 is disposed on top of the module case 17 via the multiple connecting terminals 23 and the like, so they are integrated as a module.

The module case 17 has a rectangular shape. The P-N terminals 21 project from a side wall at the side adjoining the second inverter accommodating portion 6, and the U-V-W terminals 22 project from a side wall adjoining thereto at the front end. The module case 17 has fixing legs 25 formed integrally therewith at four corners, via which the inverter module 11 will be secured to the bottom surface of the inverter accommodating portion 5 with bolts etc. At least one of these fixing legs 25 is provided with one end portion 24A of the ground earth terminal 24. The system is configured such that the ground earth terminals 24 are frame-grounded to the housing 2 by fastening the fixing legs 25 to the bottom surface of the inverter accommodating portion 5 with bolts.

A control communication cable 26 through which control signals are transmitted and received relative to a higher-level control device, i.e., a vehicle-side ECU (Electric Control Unit) is connected to the control board 19 of the inverter module 11.

Examples of the smoothing capacitor (capacitor) 18 include thin capacitors composed of flat thin film capacitors, in which resin films are stacked, and flat thin ceramic capacitors. This smoothing capacitor 18 is disposed in a space between the power system board 15 provided on the bottom side and the control board 19 provided on the upper side in the module case 17 via a fixing terminal 18A and is connected to the power line in parallel with the power system board 15 via electric connecting terminals 18B.

In the module case 17, metal shielding plates 27 and 28 made of steel plates, aluminum plates, or the like sandwiching the smoothing capacitor 18 from below and above, respectively, are provided. That is, the system is configured such that the metal shielding plate 27 is disposed between the power system board 15 and the smoothing capacitor 18, and the metal shielding plate 28 is disposed between the control board 19 and the smoothing capacitor 18, respectively, so that they can block the electromagnetic noise radiated from the smoothing capacitor 18 towards the power system board 15 and the control board 19. These two metal shielding plates 27 and 28 are frame-grounded by being electrically connected to the ground earth terminals 24.

With the above-described configuration, this embodiment provides the following advantages.

High-voltage DC power supplied from a power source unit installed in a vehicle to the integrated-inverter electric compressor 1 through a power cable is input to the terminal base 12 of the inverter device 10. This DC power is input to the pair of P-N terminals 21 on the inverter module 11 side via the common mode coil 13 and the normal mode coil 14 for removing noise, which are wired and connected via a plurality of connecting terminals provided on the terminal base 12.

The DC power input to the P-N terminals 21 is input to the switching circuit on the power system board 15 via the smoothing capacitor 18. At this time, common mode noise and current ripple are reduced by the common mode coil 13, the normal mode coil 14, and the smoothing capacitor 18. The DC power input to the power system board 15 is converted to three-phase AC power having a command frequency by the operation of the semiconductor switching devices on the power system board 15, which are controlled according to the control signals transmitted from the vehicle-side ECU to the control board 19 through the communication cable 26. This three-phase AC power is applied to the electric motor in the housing 2 from the U-V-W terminals 22 connected to the power system board 15 through the glass-sealed terminals. Thus, the electric motor is rotationally driven at the command frequency, activating the compression mechanism.

The activation of the compression mechanism causes low-temperature refrigerant gas to be taken into the housing (motor housing) 2 from the refrigerant intake port 3. This refrigerant flows around the electric motor in the direction of the motor axis, is taken into the compression mechanism, is compressed to a high-temperature, high-pressure state, is discharged into the housing (the compressor housing, not shown), and is directed outside the electric compressor 1 from the discharge port. During this time, low-temperature, low-pressure refrigerant gas taken into one end of the housing (motor housing) 2 from the refrigerant intake port 3 and flowing in the direction of the motor axis forcibly cools heat-generating components, such as semiconductor switching devices (IGBTs) and high-voltage electric components accommodated in the first and second inverter accommodating portions 5 and 6, through the wall of the housing 2.

On the other hand, while the inverter device 10 is operating, high-voltage DC power supplied from a high-voltage power source is applied to the smoothing capacitor (capacitor) 18, which is a high-voltage electric component, mounted in the inverter module 11. As a result, the smoothing capacitor 18 radiates electromagnetic noise. However, this electromagnetic noise is blocked by the two metal shielding plates 27 and 28 sandwiching the smoothing capacitor 18 from below and above.

Accordingly, it is possible to block the propagation of electromagnetic noise radiated from the smoothing capacitor 18 towards the power system board 15 and the control board 19 disposed below and above the smoothing capacitor 18. Thus, it is possible to restrict noise interference occurring at the power system board 15 and the control board 19, thereby preventing malfunction of the inverter device 10, and it is possible to prevent the electromagnetic noise from leaking out through the communication cable 26 and the power cable connected to the inverter device 10 and adversely affecting other electric components. Accordingly, the reliability of the inverter device 10 can be increased.

Because the metal shielding plates 27 and 28 are connected to the ground earth terminals 24 that are formed integrally with the module case 17 by insert molding, a noise current of the electromagnetic noise or the like propagating from the smoothing capacitor 18 to the metal shielding plates 27 and 28 is frame-grounded to the housing 2 through the ground earth terminals 24 and the inverter accommodating portion 5 and is reliably frame-grounded. Accordingly, leakage of the electromagnetic noise radiated from the smoothing capacitor 18 to the outside can be suppressed.

Because a thin smoothing capacitor, such as a film capacitor, is used as the smoothing capacitor (capacitor) 18, and because it is disposed to utilize a space between the power system board 15 and the control board 19 in the inverter module 11, the inverter device 10 can be made compact and the assembly thereof can be simplified. Furthermore, because a reduction in size of the inverter device 10 decreases the volume of the inverter accommodating portions 5 and 6 and the size of the housing 2 serving as an outer shell of the electric compressor 1, it is possible to reduce the size and weight of the integrated-inverter electric compressor 1, improving the ease of installation in a vehicle or the like. In addition, because noise interference, noise leakage, and the like can be suppressed at the inverter device 10, it is possible to increase the reliability, while preventing malfunction or the like of the inverter device 10.

Second Embodiment

Figure 5:
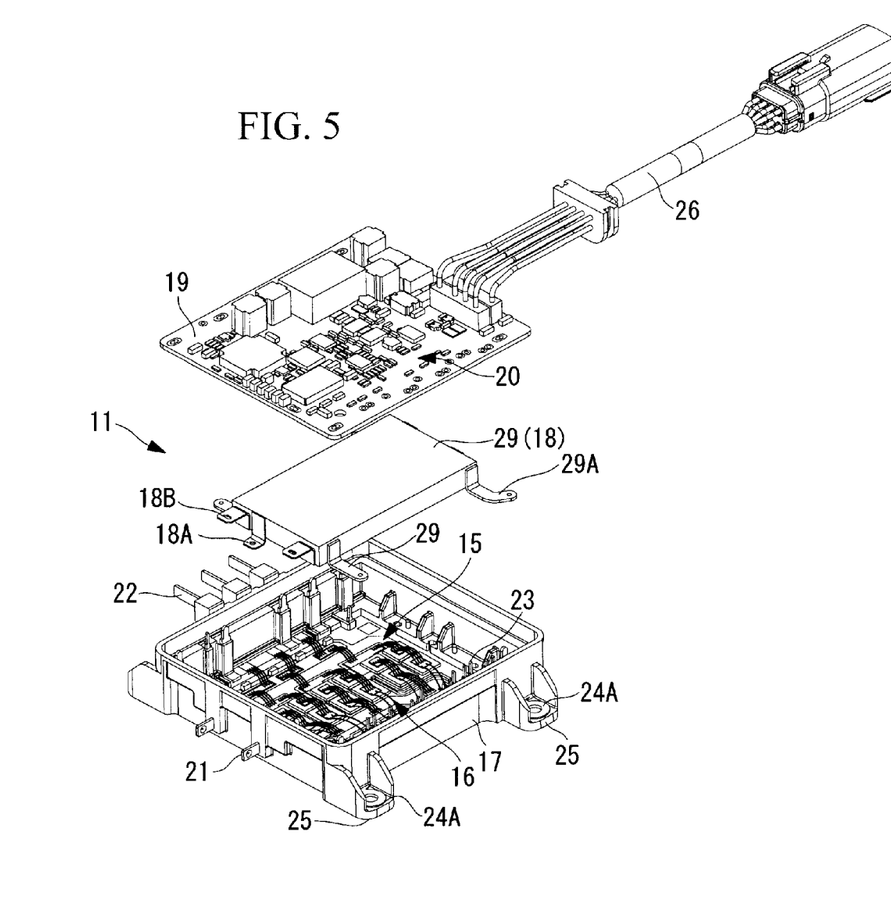
FIG. 5 is an exploded perspective view of an inverter module according to a second embodiment of the present invention.
Figure 6:
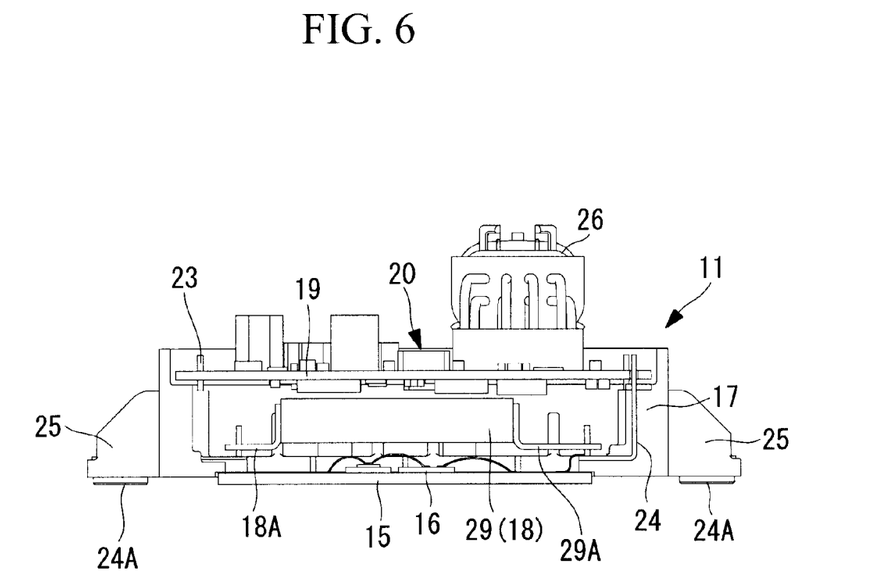
FIG. 6 is a vertical cross-sectional view of the inverter module shown in FIG. 5.

Next, a second embodiment of the present invention will be described using FIGS. 5 and 6.

This embodiment is different from the above-described first embodiment in the shielding configuration of the smoothing capacitor 18. Because the other configurations are the same as those in the first embodiment, descriptions thereof will be omitted.

This embodiment is configured such that the smoothing capacitor 18, whose outer periphery is surrounded by a metal case 29 made of a steel plate, an aluminum plate, or the like, so as to be electromagnetically shielded, is provided in the resin module case 17, instead of providing two metal shielding plates 27 and 28.

Similarly to the first embodiment, this smoothing capacitor 18 is disposed in the space between the power system board 15 and the control board 19 via the fixing terminal 18A and is connected to the power line in parallel with the power system board 15 via the electric connecting terminals 18B. Furthermore, the metal case 29 is connected to the ground earth terminals 24 via a ground connecting terminal 29A provided integrally with the frame so as to be frame-grounded.

In this manner, because the smoothing capacitor 18 is electromagnetically shielded by the metal case 29 surrounding the outer periphery thereof and is disposed in the module case 17, the propagation of electromagnetic noise radiated from the smoothing capacitor 18 towards the power system board 15 and the control board 19 due to the application of high-voltage electricity can be blocked by the metal case 29. Thus, noise interference and noise leakage due to the electromagnetic noise radiated from the smoothing capacitor 18 can be suppressed, and the same advantages as those in the first embodiment can be obtained.

The present invention is not limited to the invention according to the above-described embodiments, but can be appropriately modified within a scope not departing from the spirit thereof. For example, in the above-described embodiments, the compression mechanism of the electric compressor 1 may be a compression mechanism of any type. The common mode coil 13 of the inverter device 10 for eliminating noise does not necessarily have to be incorporated into the electric compressor 1, and the normal mode coil 14 alone may be used as a noise-removing coil, or vice versa.

The first inverter accommodating portion 5 and the second inverter accommodating portion 6 accommodating the inverter device 10 may be configured either such that they are formed integrally with the housing 2, or such that separately formed cases or the like are integrated with the housing 2. It is of course possible that two accommodating portions, i.e., the first inverter accommodating portion 5 and the second inverter accommodating portion 6, are configured as a single accommodating portion.

REFERENCE SIGNS LIST

1 integrated-inverter electric compressor
2 housing
5 first inverter accommodating portion
6 second inverter accommodating portion
10 inverter device
11 inverter module
15 power system board
17 resin module case
18 smoothing capacitor (capacitor)
19 control board
24 ground earth terminal
25 fixing leg
27, 28 metal shielding plate
29 metal case

The invention claimed is:

1. An inverter module comprising: a resin module case; a power system board provided on a bottom side of the module case, the power system board converting DC power supplied from a power source to AC power to apply the power to an electric motor; and a control board provided on an upper side of the module case, the control board controlling the AC power applied to the electric motor, wherein a smoothing capacitor connected to a power supply line for the power system board is incorporated into the module case and is disposed in a space between the power system board and the control board, and one electromagnetic shield is sandwiched between the smoothing capacitor and the power system board, and another electromagnetic shield is sandwiched between the smoothing capacitor and the control board, and the electromagnetic shields are configured to block an electromagnetic noise from the smoothing capacitor to the power system board and the control board.

2. The inverter module according to claim 1,
wherein the electromagnetic shields are metal shielding plates.

3. The inverter module according to claim 2, wherein the metal shielding plates or the metal case is connected to a ground earth terminal that is formed integrally with the module case by insert molding.

4. The inverter module according to claim 3, wherein
the ground earth terminal is formed integrally with a fixing leg provided on the module case by insert molding, and
the inverter module is configured to be frame-grounded to the housing when secured to the housing or the like via the fixing leg.

5. The inverter module according to claim 1, wherein the electromagnetic shields configure a metal case surrounding the outer periphery, and the smoothing capacitor is disposed in the module case.

6. An integrated-inverter electric compressor, wherein
an inverter accommodating portion is provided on the outer periphery of a housing accommodating a compression mechanism and an electric motor for driving the compression mechanism, and
an inverter device including the inverter module according to claim 1 is integrally incorporated in the inverter accommodating portion.

7. The integrated-inverter electric compressor according to claim 6, wherein the inverter module is secured to the inside of the inverter accommodating portion via the fixing leg of the module case so as to be frame-grounded to the housing.

* * * * *